(12) United States Patent
Mutnury et al.

(10) Patent No.: US 8,830,690 B2
(45) Date of Patent: Sep. 9, 2014

(54) MINIMIZING PLATING STUB REFLECTIONS IN A CHIP PACKAGE USING CAPACITANCE

(75) Inventors: Bhyrav M Mutnury, Austin, TX (US); Moises Cases, Austin, TX (US); Nanju Na, Essex Junction, VT (US); Tae Hong Kim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 1387 days.

(21) Appl. No.: 12/237,444

(22) Filed: Sep. 25, 2008

(65) Prior Publication Data
US 2010/0073893 A1 Mar. 25, 2010

(51) Int. Cl.
H05K 1/18 (2006.01)
H05K 1/02 (2006.01)
H05K 1/16 (2006.01)
H05K 3/24 (2006.01)

(52) U.S. Cl.
CPC .............. *H05K 1/0231* (2013.01); *H05K 1/162* (2013.01); *H01L 2224/73265* (2013.01); *H01L 2224/48227* (2013.01); *H05K 2203/049* (2013.01); *H05K 3/242* (2013.01); *H01L 2224/32225* (2013.01); *H01L 2924/15311* (2013.01)
USPC ........... 361/761; 361/760; 361/763; 361/782; 174/260; 174/261; 257/668; 257/698; 257/700; 257/706; 257/784

(58) Field of Classification Search
USPC .......... 361/761, 760, 763, 782; 174/260, 261; 257/668, 698, 700, 706, 784
See application file for complete search history.

(56) References Cited

U.S. PATENT DOCUMENTS

| 4,972,253 | A | * | 11/1990 | Palino et al. | 257/691 |
| 5,027,253 | A | * | 6/1991 | Lauffer et al. | 361/321.4 |
| 5,440,452 | A | * | 8/1995 | Kitahara | 361/773 |
| 5,459,634 | A | * | 10/1995 | Nelson et al. | 361/306.3 |
| 5,729,894 | A | * | 3/1998 | Rostoker et al. | 29/832 |
| 5,751,554 | A | * | 5/1998 | Williams et al. | 361/760 |

(Continued)

FOREIGN PATENT DOCUMENTS

KR 20040106252 A 12/2004

OTHER PUBLICATIONS

Borland, William; "Decoupling of High Performance Semiconductors Using Embedded Capacitor Technology"; Dupont Electronic Technologies, Research Triangle Park, NC 27709, 7 pages.

(Continued)

*Primary Examiner* — Xiaoliang Chen
(74) *Attorney, Agent, or Firm* — Thomas E. Tyson; Jeffrey L. Streets

(57) ABSTRACT

Embodiments of the present invention are directed to shifting the resonant frequency in a high-frequency chip package away from an operational frequency by connecting a capacitance between an open-ended plating stub and ground. One embodiment provides a multi-layer substrate for interfacing a chip with a printed circuit board. A first outer layer provides a chip mounting location. A signal interconnect is spaced from the chip mounting location, and a signal trace extends from near the chip mounting location to the signal interconnect. A chip mounted at the chip mounting location may be connected to the signal trace by wirebonding. A plating stub extends from the signal interconnect, such as to a periphery of the substrate. A capacitor is used to capacitively couple the plating stub to a ground layer.

14 Claims, 4 Drawing Sheets

(56) References Cited

U.S. PATENT DOCUMENTS

| | | | |
|---|---|---|---|
| 5,801,432 A * | 9/1998 | Rostoker et al. | 257/666 |
| 5,856,937 A * | 1/1999 | Chu et al. | 365/51 |
| 5,866,942 A * | 2/1999 | Suzuki et al. | 257/698 |
| 6,249,013 B1 * | 6/2001 | Hirose | 257/208 |
| 6,646,777 B2 * | 11/2003 | Qin et al. | 359/281 |
| 6,707,682 B2 * | 3/2004 | Akiba et al. | 361/763 |
| 6,734,545 B1 * | 5/2004 | Yamamura | 257/691 |
| 6,803,651 B1 * | 10/2004 | Chiang | 257/698 |
| 6,855,626 B2 * | 2/2005 | Sato et al. | 438/622 |
| 6,859,470 B2 * | 2/2005 | Fu et al. | 372/34 |
| 6,876,072 B1 * | 4/2005 | Wang et al. | 257/678 |
| 6,890,794 B2 * | 5/2005 | Rotem | 438/108 |
| 6,920,051 B2 * | 7/2005 | Figueroa et al. | 361/763 |
| 6,933,800 B2 * | 8/2005 | Wallace et al. | 333/12 |
| 7,047,637 B2 * | 5/2006 | deRochemont et al. | 29/855 |
| 7,049,682 B1 * | 5/2006 | Mathews et al. | 257/660 |
| 7,088,104 B2 * | 8/2006 | Bottomley | 324/328 |
| 7,095,112 B2 | 8/2006 | Endo et al. | |
| 7,123,465 B2 * | 10/2006 | Crane et al. | 361/306.2 |
| 7,133,294 B2 | 11/2006 | Patel et al. | |
| 7,151,319 B2 * | 12/2006 | Iida et al. | 257/786 |
| 7,282,648 B2 | 10/2007 | Kim et al. | |
| 7,321,166 B2 * | 1/2008 | Sakai et al. | 257/700 |
| 7,349,224 B2 | 3/2008 | Ohsaka | |
| 7,393,771 B2 * | 7/2008 | Hozoji et al. | 438/610 |
| 7,417,869 B1 * | 8/2008 | Lam | 361/763 |
| 7,428,136 B2 * | 9/2008 | Barnett | 361/306.2 |
| 7,456,498 B2 * | 11/2008 | Gasparik et al. | 257/706 |
| 7,457,132 B2 * | 11/2008 | Gisin et al. | 361/782 |
| 7,535,113 B2 * | 5/2009 | Kramer | 257/784 |
| 7,579,925 B2 * | 8/2009 | Fan et al. | 333/33 |
| 7,605,677 B2 * | 10/2009 | Oshima et al. | 333/182 |
| 7,679,926 B2 * | 3/2010 | Hsu et al. | 361/763 |
| 2004/0092136 A1 | 5/2004 | Farnworth et al. | |
| 2004/0253825 A1 | 12/2004 | Kawabata | |
| 2005/0205292 A1 * | 9/2005 | Rogers et al. | 174/255 |
| 2006/0039126 A1 * | 2/2006 | Gorcea | 361/780 |
| 2007/0184687 A1 * | 8/2007 | Kanai et al. | 439/79 |
| 2008/0236877 A1 * | 10/2008 | Amey et al. | 174/260 |

OTHER PUBLICATIONS

Wikipedia, "Interposer", Aug. 6, 2008: http://en.wikipedia.org/wiki/Interposer; 1 page.

Siliconfareast.com; Package Substrates/Interposers; Ads by Google PCB Laminate PCB FR4PCB Materials PCB Cleaning; http://www.siliconfareast.com/substrates.htm. 2 pages.

Wirebond; "Got Our Website,WS your website address for life"; Chip Wire Borad; Wirebonds and Wirebond Information: Jul. 25, 2008; http://www.wirebonds.com/. 5 pages.

* cited by examiner

MINIMIZING PLATING STUB REFLECTIONS IN A CHIP PACKAGE USING CAPACITANCE

BACKGROUND OF THE INVENTION

1. Field of the Invention

The present invention relates to chip packages, and more specifically to addressing the problem of resonance due to plating stubs in high-frequency chip packages.

2. Background of the Related Art

An integrated circuit (IC), also commonly referred to as a "microchip" or "chip," is an electronic circuit comprising miniaturized semiconductor devices formed in a semiconductor substrate. Many copies of a chip may be formed on a large semiconductor wafer and then cut into individual chips, which may be interchangeably referred to in the art as a "die chips" or "dies". However, semiconductor materials such as silicon are typically brittle, and chips made this way are fragile. Therefore, an individual die chip is commonly packaged on a carrier, referred to as a "chip package" or simply "package." The housing of the chip package protects the chip and the package provides an electrical and mechanical interface between the chip and a printed circuit board (PCB) such as a computer motherboard.

Electrical connections between a die chip and the package substrate may be made by wirebonding. Wirebonding is a process known in the art by which a very fine wire is connected from a bond pad on the chip to corresponding signal pathways ("traces") on the package substrate. Bond wires are typically formed of a highly conductive material, such as platinum or other precious metal. A package in which a die chip is connected to the substrate by wirebonding may be referred to as a "wirebond package." The traces on the substrate extend from the location of bonding with the wirebond to signal interconnects elsewhere on the substrate.

The signal interconnects on one layer of the substrate may be electrically connected to signal interconnects on another layer of the substrate using through-connections known as "vias." Thus, for example, the signal connects on the face to which the chip is mounted may be connected to corresponding pins of a pin grid array (PGA) or to corresponding balls of a ball grid array (BGA) on the opposing face of the substrate. The PGA or BGA may then be placed in contact with a corresponding pattern of electrical contacts on the PCB to which the chip package is subsequently secured.

Signal traces are typically formed of commonly available materials, such as copper, that are relatively affordable and have sufficient electrical conductivity. Materials having improved electrical conductivity, including precious metals such as platinum and gold, are then selectively applied to the substrate at locations where the expense of such materials is warranted. For example, to facilitate wire bonding, platinum may be applied at locations along the signal traces where wire bonds are formed. Gold is often applied to signal interconnects. These materials are usually applied by electroplating. However, most electroplating processes result in open plating stubs extending from the signal interconnects. The electroplating voltage is applied at or near the periphery of the package substrate, which results in the plating stubs extending to or near the periphery of the substrate. Plating stubs may hinder signal performance of the package if left intact. Signal performance is greatly impacted by reflections from the open stubs at the high operational frequencies of modern chips. A quarter-wave length resonance is particularly detrimental in high speed data transmissions.

BRIEF SUMMARY OF THE INVENTION

A first exemplary embodiment of the present invention provides a multi-layer substrate for interfacing a chip with a printed circuit board. A first outer layer provides a chip mounting location. A signal interconnect is spaced from the chip mounting location. A signal trace extends from near the chip mounting location to the signal interconnect, and a plating stub extends from the signal interconnect. A capacitor couples the plating stub to a ground layer.

A second exemplary embodiment of the invention provides a chip package. A substrate included with the chip package has a first face and an opposing second face. A chip is secured to the first face. A signal trace electrically connects the chip to a signal interconnect along the first face of the substrate. A plating stub extends outwardly from the signal interconnect, and a capacitor connects the plating stub to ground. An electrical contact disposed along the first or second face is configured for mating with a corresponding electrical contact on a printed circuit board.

A third exemplary embodiment of the invention provides a method, comprising shifting the resonant frequency caused by a plating stub in a semiconductor package away from an operational frequency by capacitively coupling the plating stub to ground.

DETAILED DESCRIPTION OF THE INVENTION

The present invention may be embodied as a method of shifting the resonant frequency in a high-frequency chip package by capacitively coupling an open-ended plating stub to ground. The plating stub may be capacitively coupled to ground using a discrete capacitor or a capacitor structure formed within a multi-layered package substrate. Likewise, the invention may also be embodied as a multi-layered package substrate in a high-frequency chip package, wherein an open-ended plating stub is capacitively coupled to ground. Capacitively coupling a plating stub to ground according to the invention provides an effective way to minimize plating stub reflections, and is more economical than other approaches to mitigating the effects of plating stubs. The invention may be applied in its various embodiments to a multitude of chip package configurations known in the art. Principles of the invention discussed in relation to the illustrated embodiments, therefore, may also be applied to configurations of a chip package other than the illustrated chip package.

Figure 1:
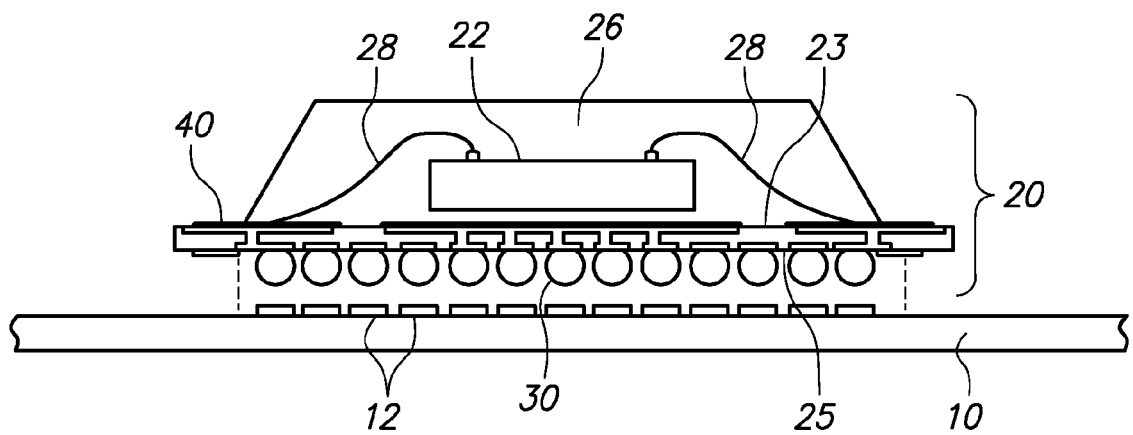
FIG. 1 is a schematic side view of a surface-mount, semiconductor chip package configured for assembly to a surface of a printed circuit board.

FIG. 1 is a schematic side view of a surface-mount, semiconductor chip package 20 configured for assembly to a surface of a printed circuit board (PCB) 10. The package substrate 40 only shows two layers for simplicity of illustration, but such a substrate usually has multiple layers. The package 20 includes a chip 22 mounted on a first face 23 of a package substrate 40. Although not required, the chip 22 may be enclosed in a protective housing 26, such as molded plastic encapsulating the chip 22. The chip 22 is electrically connected to a ball grid array (BGA) disposed on a second face 25 opposite the first face 23. In the orientation shown, the first face 23 may be referred to as the top face and the second face 25 may be referred to as the bottom face. The array of balls 30 are aligned for contact with a corresponding pattern of electrical contacts or pads 12 on the PCB 10. The balls 30 may be heated to melting or softening while in contact with the electrical pads 12 on the PCB 10, and then cooled to secure the BGA. As an alternative, pins or other electrical contacts may be provided on the substrate 40 in lieu of a ball grid array, with an appropriate choice of electrical contacts on the PCB 10 for mating with the pins or other electrical contacts on the substrate 40.

Figure 2:
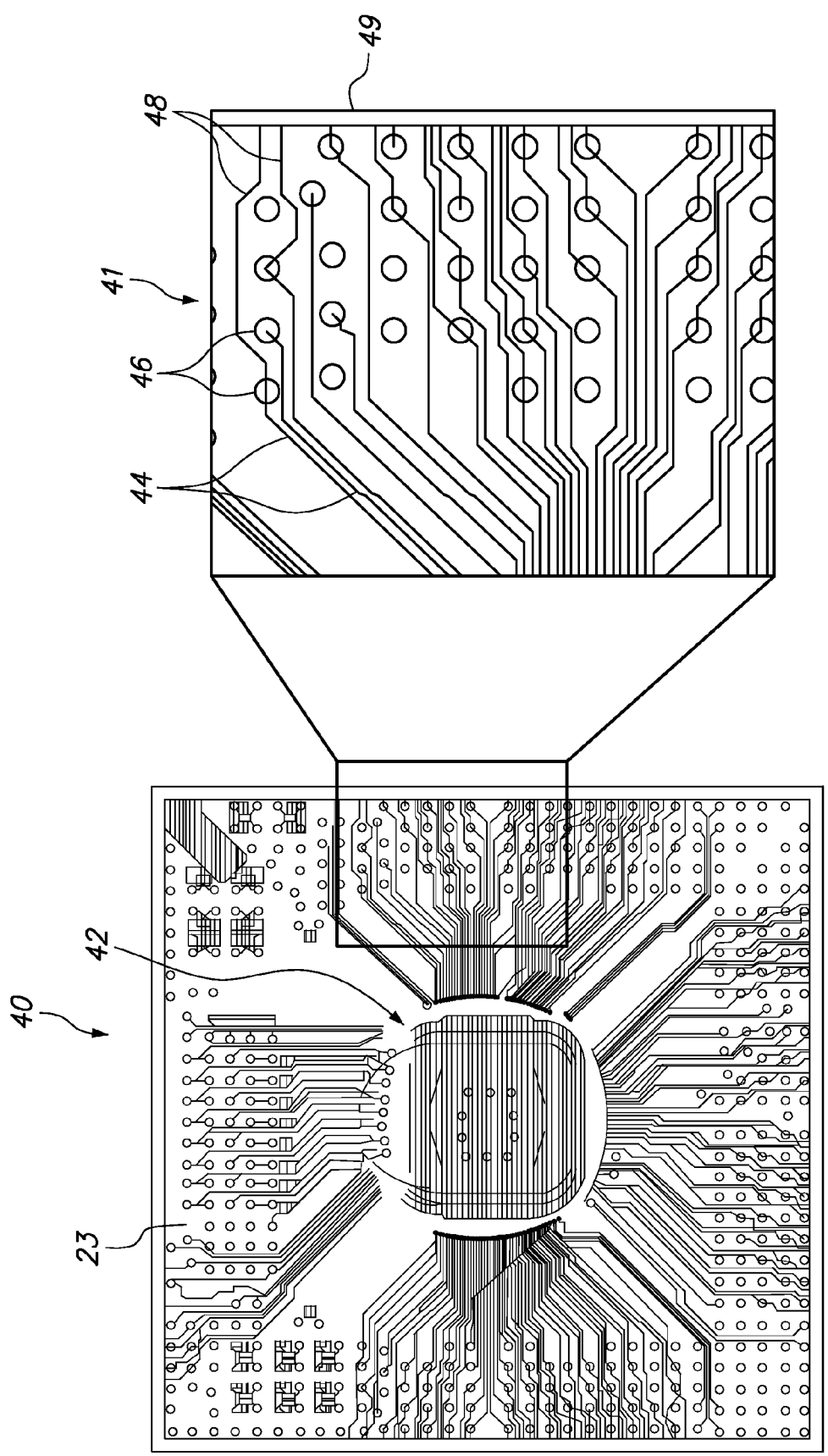
FIG. 2 is a plan view of the package substrate of FIG. 1, including an enlarged view of a portion of the substrate showing the open-ended plating stubs.

FIG. 2 is a plan view of the package substrate 40 without the chip 22, housing 26 or bond wires 28. The figure includes an enlarged view of a portion 41 of the substrate 40. The substrate 40 provides a centrally located chip mounting location 42 for receiving the chip 22 (see FIG. 1). A plurality of discrete electrical pathways, embodied here as signal traces 44, are formed on the substrate 40. The signal traces 44 may be formed according to known techniques in the art of circuit board manufacturing. The signal traces 44 may be formed, for example, by a subtractive process, in which a sheet of copper or other conductive material laminated to the substrate 40 is etched away to leave the desired pattern of traces. Less commonly, the signal traces 44 may be formed by an additive process, in which copper is plated onto the substrate 40 in the desired pattern such that no etching is required. A plurality of signal interconnects 46 (alternatively referred to as electrode pads) are shown position across the top face 23 of the substrate 40. The signal interconnects 46 are concentric with vias, which are through-holes extending through the substrate 40. Each signal trace 44 extends radially outwardly from the chip mounting location 42 to a corresponding one of the signal interconnects 46.

Features of the substrate 40 may be electroplated, such as the signal interconnects 46, the vias concentric with the signal interconnects 46, and portions of the signal traces 44 where bond wires are to be attached. As best shown in the enlarged portion 41, a plurality of open-ended plating stubs 48 extend outwardly from many of the signal interconnects 46 in a direction away from the chip mounting location 42 to a periphery 49 of the substrate 40. The plating stubs for other signal interconnects are routed on the opposite side of the substrate 40 from BGA pads to the periphery 49. The signal traces 44 and the plating stubs 48 extend radially outwardly from the centrally located chip mounting location 42, although it is not necessary for the signal traces 44 or plating stubs 48 to be straight or lie exactly on radii extending from a common center.

The plating stubs 48 are open ended by virtue of extending past the respective signal interconnects 46 without connecting to another device or conductive pathway. Typically, the open plating stubs 48 extend all the way from one of the signal interconnects 46 to or near the periphery 49 of the substrate 40, because to perform gold plating for electrode pads on the substrate 40, the electrode pads must be rendered conductive from the outer edge of the interposer. However, the invention may be embodied even on a substrate wherein the plating stubs do not extend fully to a periphery 49. For example, any present or future-developed electroplating process that results in an open plating stub extending radially outward from a signal interconnect may benefit from an embodiment of the invention, regardless of whether the plating stub extends completely to the periphery of a package substrate.

Figure 3:
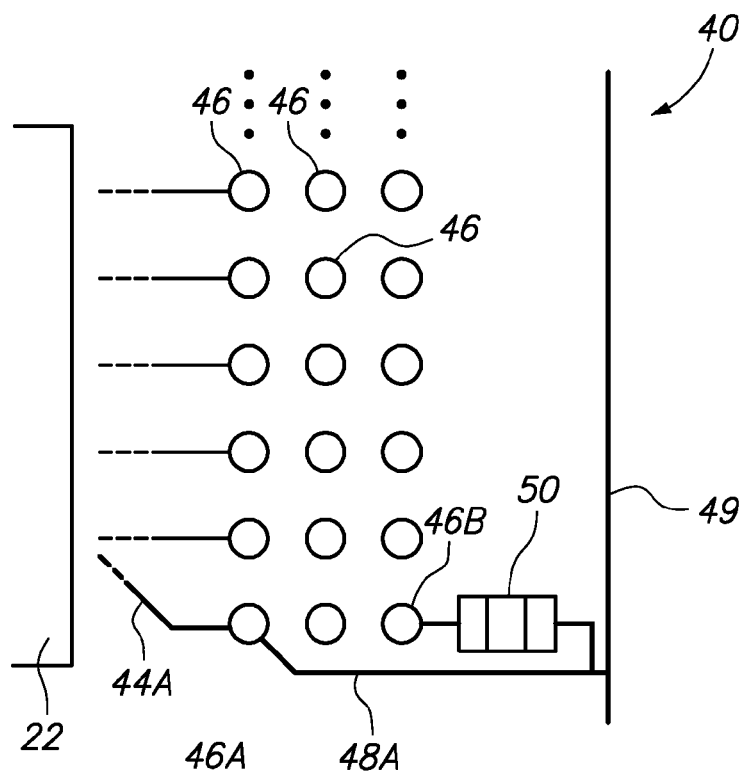
FIG. 3 is a schematic plan view of the package substrate of FIG. 1 wherein capacitance is connected between one of the plating stubs and ground to shift the quarter-wave-length resonance to a lower frequency band.

FIG. 3 is a schematic plan view of the package substrate 40 wherein a capacitor 50 is connected between a plating stub 48A and ground to shift the quarter-wave-length resonance caused by the presence of the plating stub 48A to a lower frequency band. The capacitor 50 may take the form of a discrete capacitor or an embedded capacitor formed in the substrate 40, examples of which are discussed in relation to FIGS. 5, 6, and 7. A particular signal trace 44A is electrically coupled to the chip 22, e.g. using a bond wire, and extends radially outwardly from the chip 22 to a particular signal interconnect 46A. The open-ended plating stub 48A extends outwardly from the signal interconnect 46A to the periphery 49 of the substrate 40. The capacitor 50 is connected between the plating stub 48A and ground, in this case by virtue of connection to a "ground" signal interconnect 46B. The ground signal interconnect 46B is in electrical communication with a ground layer in the multi-layer substrate 40.

Figure 4:
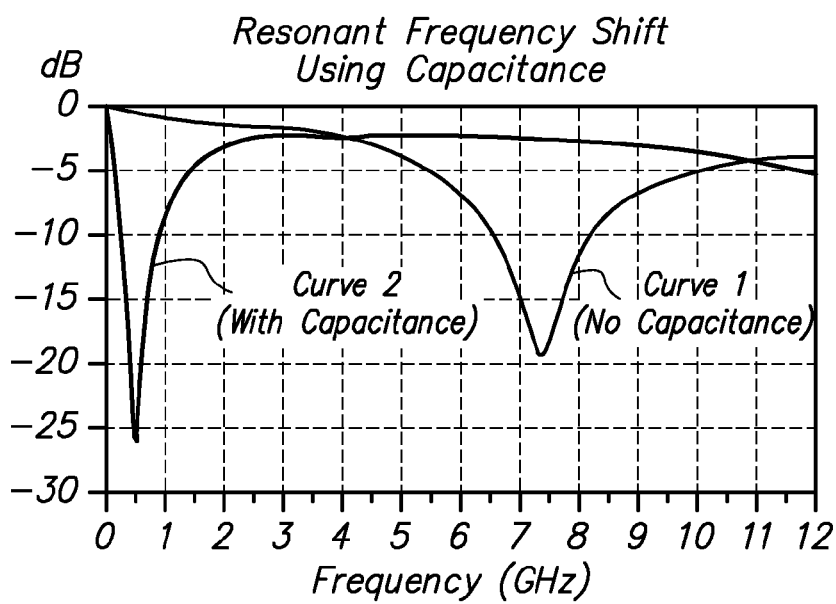
FIG. 4 is a graph illustrating the resonant frequency shift by virtue of connecting the capacitance between a plating stub and ground.

FIG. 4 is a graph illustrating the resonant frequency shift caused by capacitively coupling of a plating stub to ground. Curve 1 illustrates the signal performance for signals communicated along the signal trace 44A in FIG. 3, assuming the plating stub 48A has a stub length of 7 mm. The local maxima (peak) of Curve 1 indicates a resonant frequency occurring at about 7 GHz, which is the operational frequency of signals communicated along the signal trace 44A. The 7 GHz resonant frequency caused by the presence of the plating stub 48A imposes substantial signal interference, and is detrimental to high-speed signal transmission along the signal trace 44A. Curve 2 illustrates the signal performance for signals communicated along the signal trace 44A in FIG. 3, after a 50 picofarad (pF) capacitance has been added between the plating stub and ground. The resonant frequency is shifted to less than 1 GHz as a result of the added capacitance, which avoids the operational frequency and greatly reduces or eliminates the interference that would otherwise be caused by an open plating stub. In this example, there is an improvement of approximately 15 dB by adding the 50 pF capacitance.

Figure 5:
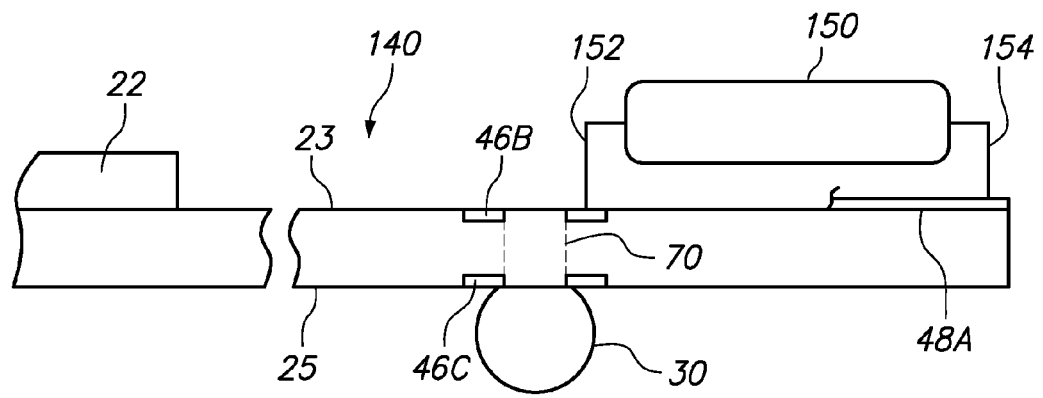
FIG. 5 is a side view of an embodiment of a package substrate incorporating a discrete capacitor connected between the plating stub and ground.
Figure 6:
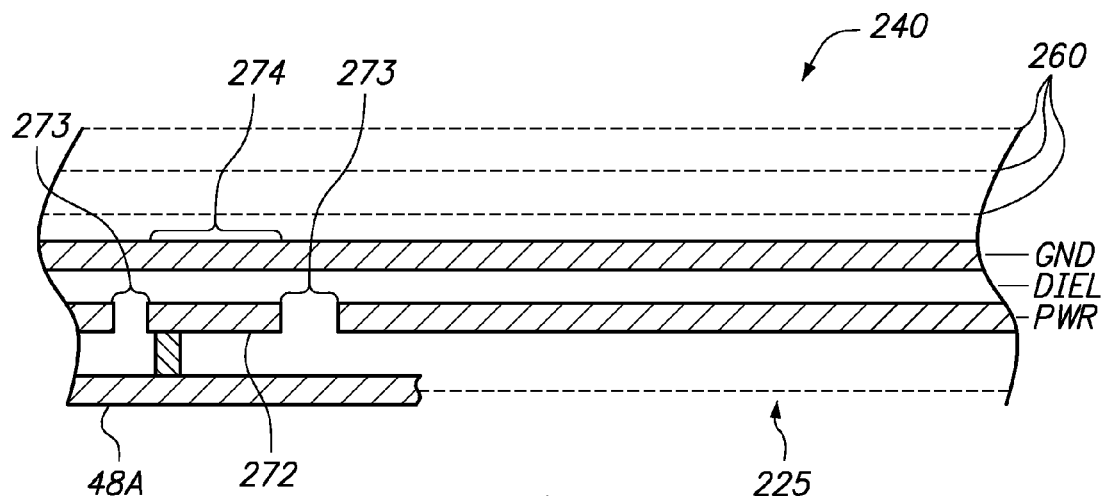
FIG. 6 is a side view of an embodiment of a package substrate incorporating an embedded capacitance for connecting between the plating stub and ground.
Figure 7:
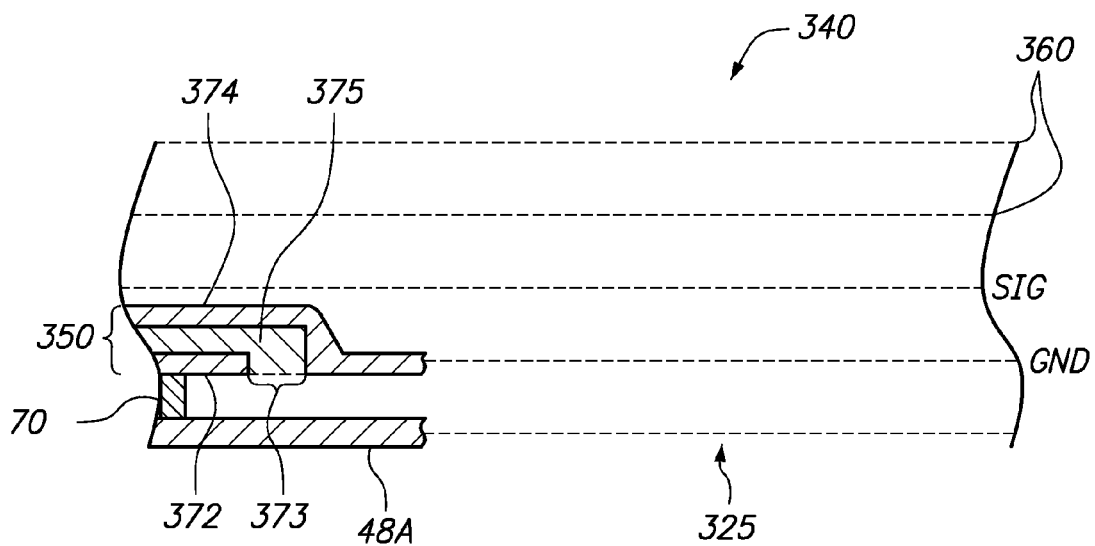
FIG. 7 is a side view of another embodiment of a package substrate incorporating an alternative embedded capacitance for connecting between the plating stub and ground.

A myriad of possible layering configurations in a package substrate are possible. Additionally, a variety of capacitor types may be selected according to different embodiments of the invention. Accordingly, a substrate incorporating capacitance between a plating stub and ground, as schematically shown in FIG. 3, may be embodied in many different ways, examples of which are shown in FIGS. 5-7. In the examples that follow, FIG. 5 shows an embodiment of a substrate using a discrete capacitor, while FIGS. 6 and 7 show alternative embodiments of a substrate using an embedded capacitor.

FIG. 5 is a cross-sectional side view of an embodiment of a package substrate 140 incorporating a discrete capacitor 150 for connecting the plating stub 48A to ground. The capacitor 150 includes a first lead 154 connected to the plating stub 48A and a second lead 152 connected to the ground signal interconnect 46B according to an embodiment of the invention. The ground signal interconnect 46B on the top face 23 of the substrate 140 is connected through the substrate 140 by a via 70 to a ground signal interconnect 46C on the opposing, bottom face 25 of the substrate 140. A conductive ball 30 from the ball grid array is in contact with the ground signal interconnect 46C. When the substrate 140 is connected to a PCB, the ground signal interconnect 46C may be placed in contact with a ground terminal on the PCB, so that the capacitor 150 is connected between the plating stub 48A and ground.

The use of a discrete capacitor, such as in FIG. 5, can be a relatively low cost solution to providing capacitance for shifting the resonant frequency away from the operational frequency according to an aspect of the invention. However, an alternative to a discrete capacitor is an "embedded capacitor," which may be interchangeably referred to as a "buried capacitor." An embedded capacitor avoids the particular noise problems that can be caused by the presence of capacitor leads in a discrete capacitor. A buried capacitor in the context of a package substrate typically includes a layer of dielectric sandwiched between two metal layers, formed as part of a multi-layer package substrate. One metal layer may be provided in a power or ground plane and the other metal layer may be provided in a ground plane.

FIG. 6 is a cross-sectional side view of an embodiment of a multi-layered package substrate 240 incorporating an embedded capacitor 250 for connecting the plating stub 48A to ground. Each layer of the substrate 240 lies in a respective plane 260, indicated by dashed lines. The substrate 240 may have any number of multiple layers, and a comprehensive discussion of every layer is not required here. The substrate 240 includes a dielectric layer ("DIEL") sandwiched between a ground layer ("GND") and a power layer ("PWR"). The GND and PWR layers are above the bottom face 225 at the bottom of the substrate 240. The plating stub 48A extends along the bottom face 225 of the substrate 240 from a first interconnect (not shown) to the via 70. The via 70 electrically connects the plating stub 48A to a capacitor plate 272 formed in the PWR layer. The capacitor plate 272 is an isolated conductor, separated from other elements in the PWR layer by gaps 273. The capacitor plate 272 is isolated from other elements in the PWR layer. A portion of the GND layer opposite the first capacitor plate 272 serves as a second capacitor plate 274, which is separated from the first capacitor plate 272 by the DIEL layer. Thus, the embedded capacitor 250 includes the first and second capacitor plates 272, 274 separated by the DIEL layer. By connecting the plating stub 48A to ground using the capacitor 250, signal reflections in the plating stub 48A are altered. Specifically, the presence of the embedded capacitor 250 alters the behavior of electrical activity in the plating stub 48A by shifting the resonant frequency as exemplified in the graph of FIG. 4.

FIG. 7 is a cross-sectional side view of the multi-layered package substrate 340 incorporating an alternative embedded capacitor 350 for connecting the plating stub 48A to ground. The number of layers 360 of the substrate 340 in this embodiment may be different than the number of layers 260 in the embodiment of FIG. 6. The substrate 340 includes a ground layer ("GND") and a signal layer ("SIG"). The GND and SIG layers are inwardly located from the outermost plane that contains an outer signal layer 325 at the bottom of the substrate 340. The plating stub 48A extends along the outer signal layer 325 of the substrate 340 to the via 70. The via 70 electrically connects the plating stub 48A to a capacitor plate 372 formed in the GND layer and separated from other elements in the GND layer by a gap 373. A portion of the SIG layer opposite the first capacitor plate 372 serves as a second capacitor plate 374, which is separated from the first capacitor plate 372 by a dielectric material 375. Thus, the capacitor 50 schematically shown in FIG. 3 is embodied here as an embedded capacitor 350 that includes the first and second capacitor plates 372, 374 as separated by the dielectric material 375. The dielectric material 375 between the capacitor plates 372, 374 is usually a material having a relatively high dielectric constant (K). The second capacitor plate 374 is a layer between SIG and GND, and is connected to GND as shown.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A multi-layer substrate for interfacing a chip with a printed circuit board, comprising:
    a first outer layer providing a chip mounting location, a signal interconnect spaced from the chip mounting location, a signal trace extending from near the chip mounting location to the signal interconnect, and a plating stub extending from the signal interconnect;
    a ground layer; and
    a capacitor coupling the plating stub to the ground layer.

2. The multi-layer substrate of claim 1, wherein the capacitor comprises a discrete capacitor secured to the first outer layer, the discrete capacitor including a first lead electrically connected to the plating stub and a second lead electrically connected to the ground layer.

3. The multi-layer substrate of claim 1, wherein the capacitor is embedded within the multi-layer substrate.

4. The multi-layer substrate of claim 3, wherein the capacitor embedded within the multi-layer substrate comprises:
    a first capacitor plate formed in the ground layer; and
    a second capacitor plate formed in another layer spaced from the ground layer.

5. The multi-layer substrate of claim 3, wherein the second capacitor plate is formed in a power layer.

6. The multi-layer substrate of claim 1, further comprising a via concentric with and in electrical communication with the signal interconnect.

7. The multi-layer substrate of claim 6, further comprising:
    a second outer layer opposite the first outer layer, wherein the via extends from the first outer layer to the second outer layer; and a ball of a ball grid array connected with the via on the second outer layer.

8. A chip package, comprising:

a multi-layer substrate having a first outer face and an opposing second outer face;

a chip secured to the first face of the substrate;

a signal interconnect along the first face of the substrate, a signal trace electrically connecting the chip to the signal interconnect, a plating stub extending outwardly from the signal interconnect, and a capacitor connecting the plating stub to ground; and an electrical contact disposed along the first or second face and configured for mating with a corresponding electrical contact on a printed circuit board.

9. The chip package of claim 8, wherein the electrical contact disposed along the first or second face comprises a ball of a ball grid array.

10. The chip package of claim 8, further comprising a bond wire electrically connecting the chip to the signal trace.

11. The chip package of claim 8, wherein the capacitor comprises a discrete capacitor secured to the first outer face, the discrete capacitor including a first lead electrically connected to the plating stub and a second lead electrically connected to a ground layer in the multi-layer substrate.

12. The chip package of claim 8, wherein the capacitor is embedded within the multi-layer substrate.

13. The chip package of claim 12, wherein the capacitor embedded within the multi-layer substrate comprises:

a first capacitor plate formed in the ground layer; and a second capacitor plate formed in another layer spaced from the ground layer.

14. The chip package of claim 12, wherein the second capacitor plate is formed in a power layer of the multi-layer substrate.

* * * * *